(12) United States Patent
Oyama (10) Patent No.: US 6,956,781 B2
(45) Date of Patent: Oct. 18, 2005

(54) AMPLIFIER AND SEMICONDUCTOR STORAGE DEVICE USING THE SAME

(75) Inventor: Kazuhiko Oyama, Miyazaki (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 75 days.

(21) Appl. No.: 10/768,061

(22) Filed: Feb. 2, 2004

(65) Prior Publication Data

US 2005/0024966 A1 Feb. 3, 2005

(30) Foreign Application Priority Data

Jul. 28, 2003 (JP) .............................. 2003-281117

(51) Int. Cl.[7] .............................................. G11C 7/02
(52) U.S. Cl. ................ 365/207; 365/205; 365/189.09; 365/189.11; 365/185.21
(58) Field of Search ............................... 365/207, 205, 365/189.09, 189.11, 185.21

(56) References Cited

U.S. PATENT DOCUMENTS

| 5,877,985 A | * | 3/1999 | Banba et al. ............... 365/207 |
| 5,917,765 A | * | 6/1999 | Morishita et al. ........... 365/201 |
| 6,072,742 A | * | 6/2000 | Ooishi .................... 365/189.09 |
| 6,411,549 B1 | * | 6/2002 | Pathak et al. .......... 365/185.21 |

FOREIGN PATENT DOCUMENTS

JP      2000-331486      11/2000

* cited by examiner

Primary Examiner—Richard Elms
Assistant Examiner—Tuan T. Nguyen
(74) Attorney, Agent, or Firm—Volentine Francos & Whitt, PLLC (57) ABSTRACT

When a first memory cell storing data '0' is read, an associated word line is set at an 'H' level, and an associated NMOS is turn on by a signal having an 'H' level so as to select the first memory cell. In the first memory cell, a drain voltage is reduced to a grounding level via the NMOS, and an electrical potential difference is generated between a source and the drain. However, no channel is formed so that no electrical current flows. Since a parasitic capacitance exists between associated bit lines, the electrical potential of a node is reduced to the ground level due to the coupling effect of the parasitic capacitance. Accordingly, a charging current flows to the node. In addition, a direct current flows from the node to the ground via another NMOS. Consequently, electrical charging to the parasitic capacitance starts earlier, and a reading delay time can be reduced.

20 Claims, 4 Drawing Sheets

AMPLIFIER AND SEMICONDUCTOR STORAGE DEVICE USING THE SAME

BACKGROUND OF THE INVENTION

1) Field of the Invention

The present invention relates to an amplifier and a semiconductor storage device, which includes an amplifier, such as a nonvolatile memory which has a storage data reading circuit and is electrically writable, i.e., an erasable programmable read-only memory (hereinafter referred to as an EPROM).

2) Description of the Related Art

Conventional art in the technology concerning the EPROM is disclosed, for example, in Japanese Patent Kokai No. 2000-331486. The EPROM includes a plurality of memory cell blocks which are selected by block selection signals. The memory cell blocks are arranged in parallel with each other and each of the memory cell blocks includes a plurality of word lines decoded by external address inputs, a plurality of first bit lines arranged in parallel with each other having predetermined spaces therebetween so as to be directed perpendicular to the word lines, and a plurality of second bit lines respectively arranged beside the first bit lines so as to be parallel with each other. The second bit lines are connected to grounding potential nodes (hereinafter referred to as a GND) in response to signals decoded by the address input. Memory cells each including a MOS transistor are respectively positioned at intersecting points of the word lines, and the first and second bit line pairs so as to form a matrix pattern. Each memory cell includes a source, a drain and a floating gate, which are respectively connected to the first bit line, the second bit line and the word line.

Around the memory cell blocks, there are provided circuits such as writing circuits for writing data and reading circuits for reading data. These circuits are connected to the memory cell blocks. The writing circuit writes the data to the memory cell in, for example, the following procedures: after data in all of the memory cells are erased, a memory cell is selected by the word line, and a negative high voltage is applied between the source and the drain of the selected memory cell so as to charge electrons to the floating gate. Accordingly, data '0' is written to the memory cell. The memory cell having the data '0' maintains the electron-charged state in the floating gate, even if the power supply is stopped, until the data is erased by an ultraviolet ray or an X-ray. On the other hand, a memory cell in which data is not written is in a data '1' state.

The reading circuit reads the data in, for example, the following procedures: the first bit line is set at a high level (hereinafter referred to as an 'H' level) and the second bit line is set at a low level, i.e., a grounding potential level (hereinafter referred to as an 'L' level), and then the external address input is decoded so as to select the word line. With respect to the memory cell having the data '0', even though an electrical potential difference is generated between the source of the first bit line and the drain of the second bit line upon selection of the word line connected to the floating gate, no channel is formed within the memory cell, and no current flows between the source and the drain. Accordingly, an electrical potential of the first bit line is kept at the 'H' level, and the electrical potential is inverted and amplified by the reading circuit so that data '0' having the grounding potential is output. On the contrary, with respect to the memory cell having the data '1', when an electrical potential difference is generated between the source of the first bit line and the drain of the second bit line upon selection of the word line connected to the floating gate during a reading operation, a channel is formed within the memory cell, and thus an electrical current flows between the source of the first bit line and the drain of the second bit line. Accordingly, an electrical potential of the first bit line is reduced to the electrical potential of the grounding potential side having the 'L' level, and the electrical potential of the first bit line is inverted and amplified by the reading circuit so that data '1' having the power supply potential (hereinafter referred to as a VCC) is output.

The conventional EPROM disclosed in Japanese Patent Kokai No. 2000-331486 however has the following problem.

Because of a capacity increase of the semiconductor storage device in recent years, the number of word lines as well as the number of first and second bit lines of memory cell blocks are increasing. In addition, lengths of the lines are increasing. Furthermore, the increase of lengths of the first and second bit lines increases an inter-wire capacitance, i.e., a parasitic capacitance, between the first bit line and the second bit line which are adjacent to each other.

Suppose, for example, that a reading operation from the '1' memory cell is shifted to a reading operation from the '0' memory cell. An electrical current initially flows from the source on the first bit line side having the 'H' level to the drain on the second bit line side having the grounding potential level in the '1' memory cell. When the above reading operation from the '1' memory cell is shifted to the reading operation from the '1' memory cell, the electrical potential of the first bit line at the source side tends to increase toward the 'H' level, since no electrical current flows in the '0' memory cell. However, since the parasitic capacitance exists between the first bit line and the second bit line, an electrical current momently flows through the parasitic capacitance by a coupling effect of the parasitic capacitance, and the electrical potential of the first bit line is reduced to the grounding potential side. Subsequently, the parasitic capacitance is charged and the electrical current stops flowing so that the first bit line increases to the 'H' level. The momently decrease of the first bit line by the coupling effect affects the reading circuit and finally causes the problem of a reading access delay of a short period Δt at the read output.

As described above, because of the remarkably increasing value of the parasitic capacitance between the first bit line and the second bit line in recent years, the reading access delay in proportional to the parasitic capacitance appears to be an unignorable problem. Therefore, it is expected to solve the problem without using a complex circuit structure.

SUMMARY OF THE INVENTION

One object of the present invention is to provide an amplifier which can suppress a delay of an amplifying operation caused by a noise of an input signal without using a complex circuit structure.

Another object of the present invention is to provide an amplifier which has an advantage in view of a decreased layout area when the amplifier is provided in an integrated circuit.

Yet another object of the present invention is to provide an amplifier which can be applied to a semiconductor device which needs to suppress an influence of a delay of an amplifying operation caused from a noise of an input signal.

Still another object of the present invention is to provide a semiconductor storage device which has the amplifier in a reading circuit of the semiconductor storage device so as to suppress a reading access delay caused by a parasitic capacitance existing between bit lines.

According to a first aspect of the present invention, there is provided an amplifier including an input node being shifted from a first power supply potential to a second power supply potential during a first mode in response to a selection signal, and being maintained at the first power supply potential during a second mode, an amplification circuit connected to the input node for amplifying an electrical potential of the input node and outputting the amplified potential from a first output node in response to a control signal, and a constant voltage circuit connected to the first output node for stabilizing the electrical potential of the first output node and outputting the stabilized potential from a second output node.

The amplification circuit includes a first and second transistors for loading, and a third and a fourth transistors for input. The first transistor has a first control electrode, a first electrode connected to a first power supply potential node or a second power supply potential node, and a second electrode connected to the first output node. The second transistor has a second control electrode connected to the first control electrode, a third electrode connected to the first power supply potential node or the second power supply potential node, and a fourth electrode connected to the second control electrode. The third transistor has a third control electrode connected to the input node, a fifth electrode connected to the second power supply potential node or the first power supply potential node, and a sixth electrode connected to the first output node. The fourth transistor has a fourth control electrode applied an intermediate electrical potential between the first power supply potential and the second power supply potential, a seventh electrode connected to the second power supply potential node or the first power supply potential node, and an eighth electrode connected to the fourth electrode.

The constant voltage circuit includes a fifth and a sixth transistors, and a pull-down element. The fifth transistor has a fifth control electrode connected to the second output node, a ninth electrode connected to the first power supply potential node, and a tenth electrode connected to the fifth control electrode. The sixth transistor has a sixth control electrode connected to the first output node, an eleventh electrode connected to the input node, and a twelfth electrode connected to the tenth electrode. The pull-down element is connected between the input node and the second power supply potential node.

According to a second aspect of the present invention, there is provided an amplifier including an input node identical to that of the first aspect of the present invention, and an amplification circuit and a constant voltage circuit having different configurations from those of the first aspect of the present invention.

The amplification circuit includes a first, second, third and fourth transistors which are similar to the first aspect of the present invention, and furthermore the constant voltage circuit includes a fifth transistor which is similar to the first aspect of the present invention and a sixth transistor. Instead of the pull-down element within the constant voltage circuit of the first aspect of the present invention, a dimension of the first transistor in the amplification circuit is n times as large as that of the second transistor, and a dimension of the third transistor is n times as large as that of the fourth transistor, where n denotes an arbitrary number more than 1.

According to a third aspect of the present invention, there is provided a semiconductor storage device which uses the amplifier of the first aspect of the present invention. Specifically, the semiconductor storage device of the third aspect of the present invention includes a plurality of word lines, a plurality of first bit lines, a plurality of second bit lines, a third bit line, a fourth bit line, a plurality of first memory cells, a plurality of second memory cells, an amplifier of the first aspect of the present invention, a reference amplifier, and a differential amplifier.

The word lines are arranged in parallel to each other so as to be decoded by an external address input. The first bit lines are arranged in parallel to each other and having predetermined spaces therebetween, the first bit lines extending perpendicular to the word lines. The second bit lines are respectively arranged beside the first bit lines so as to define a plurality of pairs of first and second bit lines, the second bit lines being parallel with the first bit lines and connected to the second power supply potential node of the first aspect of the present invention in response to the selection signal of the first aspect of the present invention decoded by an address input. The third bit line is arranged in parallel with the second bit lines. The fourth bit line is arranged beside the third bit line so as to define a pair of third and fourth bit lines, the fourth bit line being parallel with the third bit line and connected to the second power supply potential node. The first memory cells are respectively positioned at intersecting points of the word lines, and the pairs of first and second bit lines so as to form a matrix pattern, each said first memory cell including a first electrode connected to the first bit line concerned, a second electrode connected to the second bit line paired with the first bit line concerned, and a floating gate connected to the word line concerned.

The second memory cells are respectively positioned at intersecting points of the word lines, and the pair of third and fourth bit lines, each said second memory cell including a first electrode connected to the third bit line, a second electrode connected to the fourth bit line, and a floating gate connected to the word line concerned. The amplifier of the first aspect of the present invention is commonly connected to one ends of the first bit lines. The reference amplifier is connected to one end of the third bit line for amplifying an electrical potential of the one end of the third bit line and outputting the amplified potential to an output node in response to the control signal of the first aspect of the present invention, and the reference amplifier includes an amplifying circuit which is the same as the amplification circuit of the first aspect of the present invention, and a constant voltage circuit. The constant voltage circuit is formed by a transistor having a dimension multiple times as large as that of the fifth transistor of the first aspect of the present invention, a transistor identical to the sixth transistor of the first aspect of the present invention, and a pull-down element identical to the pull-down element of the first aspect of the present invention. The differential amplifier is connected to a second output node of the amplifier and an output node of the reference amplifier for amplifying a difference between an electrical potential of the second output node of the amplifier and an electrical potential of the output node of the reference amplifier and for outputting the amplified difference as a reading signal in response to the control signal.

According to a fourth aspect of the present invention, there is provided a semiconductor storage device which uses the amplifier of the second aspect of the present invention. Specifically, the semiconductor storage device of the fourth aspect of the present invention includes a plurality of word lines, a plurality of first bit lines, a third bit line, a fourth bit line, a plurality of first memory cells, a plurality of second memory cells, and a differential amplifier, which are identical to the third aspect of the present invention, and a plurality of second bit lines, an amplifier, and a reference amplifier, which are different from the third aspect of the present invention.

The second bit lines are respectively arranged beside the first bit lines so as to define a plurality of pairs of first and second bit lines, the second bit lines being parallel with the first bit lines and connected to the second power supply potential node of the second aspect of the present invention in response to the selection signal of the second aspect of the present invention decoded by an address input. The amplifier is the same as the amplifier of the second aspect of the present invention which is commonly connected to one ends of the first bit lines. The reference amplifier is connected to one end of the third bit line for amplifying an electrical potential of the one end of the third bit line and outputting the amplified potential to an output node in response to the control signal of the second aspect of the present invention, and the reference amplifier includes an amplifying circuit which is the same as the amplification circuit of the second aspect of the present invention, and a constant voltage circuit. The constant voltage circuit is formed by a transistor having a dimension multiple times as large as that of the fifth transistor of the second aspect of the present invention, and a transistor identical to the sixth transistor of the second aspect of the present invention.

In the amplifier of the first aspect of the present invention, the pull-down element formed by the element such as the transistor or the resistor element is provided within the constant voltage circuit. Therefore, when the input node maintained at the first power supply potential is momently shifted to the second power supply potential by an influence of a noise during the second mode, a direct current flows from the input node to the second power supply potential via the pull-down element, in addition to an electrical current flowing to the input node. Accordingly, electrical charging to the input node starts earlier, and an electrical current supplying capacity of the constant voltage circuit is increased. Consequently, the electrical potential of the input node can quickly return to a desired level, thus the delay time of subsequent amplifying operation can be decreased.

In the amplifier of the second aspect of the present invention, the dimension of the first transistor in the amplification circuit is set to be n times as large as that of the second transistor, and the dimension of the third transistor is set to be n times as large as that of the fourth transistor. Therefore, when the input node maintained at the first power supply potential is momently shifted to the second power supply potential by an influence of a noise during the second mode, an electrical current having a value n times as large as that flowing through the second and the fourth transistors of the intermediate electrical potential side flows through the first and the third transistor on the input node side. Accordingly, an amount of the charging current to the input node is increased, and a response rate of the amplifier is improved so that the charging time to the input node is decreased. Consequently, the input node can quickly return to the desired level, and a delay time of a subsequent amplification operation can be decreased. Furthermore, it is not necessary to provide the pull-down element, and thus it has an advantage in view of a decreased layout area in the amplifier.

In the semiconductor storage device using the amplifier of the present invention, when, for example, a charging current flows to an input node by the coupling effect of the parasitic capacitance, which exists between the first and the second bit lines, during the reading operation of the memory cell storing the data '0', the electrical potential of the input node can quickly return to a desired level, and thus the delay time of the subsequent reading operation can be decreased.

In the amplifier of the present invention, the input node is shifted from the first power supply potential to the second power supply potential during the first mode in response to the selection signal, and is maintained at the first power supply potential during the second mode. The input node is connected to the amplification circuit and the constant voltage circuit. The amplification circuit amplifies an electrical potential of the input node and outputs the amplified potential from the first output node in response to the control signal. The amplification circuit includes the first and second transistors for loading and a third and a fourth transistors for input so as to form the differential amplifying circuit of a current mirror configuration. The constant voltage circuit stabilizes the electrical potential of the first output node and outputs the stabilized potential from the second output node. The constant voltage circuit includes the fifth transistor having the fifth control electrode and the tenth electrode connected to the second output node, and the sixth transistor having the sixth control electrode connected to the first output node. The constant voltage circuit is connected in series between the first power supply potential node and the input node. Moreover, the pull-down element is connected between the input node and the second power supply potential node.

When, for example, the input node maintained at the first power supply potential during the second mode is momently shifted to the second power supply potential by an influence of a noise, a direct current flows from the input node to the second power supply potential node via the pull-down element, in addition to the electrical current flowing to the input node. Accordingly, the electrical charge to the input node starts earlier, and the electrical current supplying capacity of the constant voltage circuit is improved. Consequently, the electrical potential of the input node quickly returns to a desired level, and thus the delay time of a subsequent amplifying operation is decreased.

These and other objects, aspects and advantages of the present invention will be more clear when the following preferred embodiments are read with referring to the accompanying drawings. It should be noted that the drawings are merely presented for the purpose of illustration, and are not presented to limit the scope of the present invention.

DETAILED DESCRIPTION OF THE INVENTION

Figure 1:
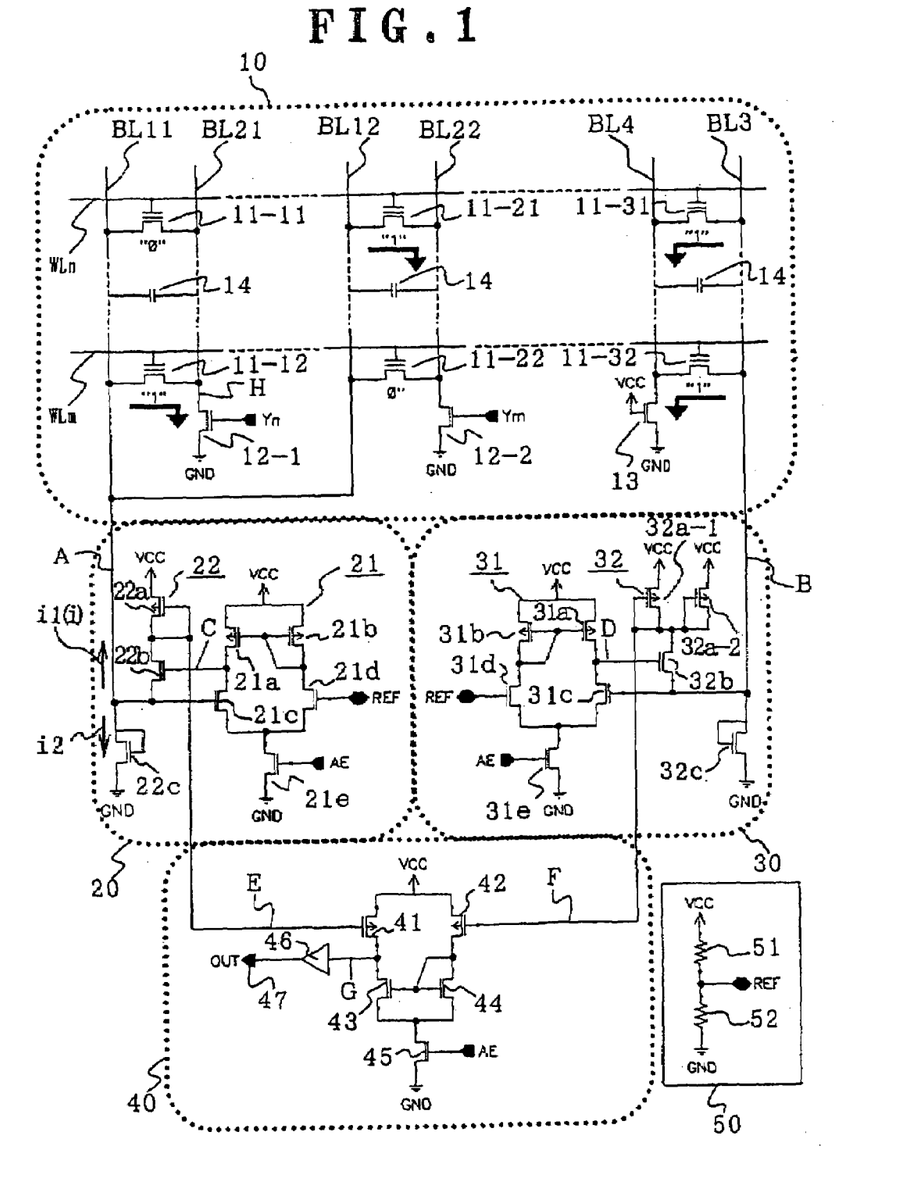
FIG. 1 is a schematic circuit diagram of an EPROM according to a first embodiment of the present invention.

In FIG. 1, circuits such as an address decoder for selecting word lines and a writing circuit for writing data are omitted.

An EPROM 9 includes a memory cell block 10 for storing data. The memory cell block 10 is connected to a reading circuit 11 for reading the data from the memory cell block 10. The reading circuit 11 includes an amplifier 20 (hereinafter referred to as a real cell amplifier) for amplifying the data read from the memory cell block 10, a reference amplifier 30 for amplifying reference data read from the memory cell block 10, and a sense amplifier 40, i.e., a differential amplifier for differentially amplifying an output voltage of the real cell amplifier 20 and an output voltage of the reference amplifier 30. The EPROM 9 further includes an internal voltage-down circuit 50 for generating an intermediate electrical potential REF, e.g., 2V, which has a value between a first power supply potential, e.g., the VCC=4V, and a second power supply potential, e.g., the grounding potential=0V. The internal voltage-down circuit 50 includes two voltage dividing resistor elements 51 and 52 which are connected in series between the VCC node and the GND. The intermediate electrical potential REF is output from a connection point of the voltage dividing resistor elements 51 and 52.

In the memory cell block 10, a plurality of word lines WLm, WLn, . . . , are arranged in parallel to each other which are decoded by an external address input. A plurality of first bit lines BL11, BL12, . . . for data transmission are arranged in parallel to each other having predetermined spaces therebetween so as to be directed perpendicular to the word lines WLm, WLn, . . . . Beside the first bit lines BL11, BL12, a plurality of second bit lines BL21, BL22, . . . for reducing the electrical potentials are respectively arranged so as to be parallel with each other. Furthermore, a single third bit line BL3 for reference data transmission is arranged in parallel with the second bit lines BL21, BL22, . . . . Beside the third bit line BL3, a single fourth bit line BL4 for reducing the electrical potential is arranged so as to be parallel with the third bit line BL3.

A plurality of first memory cells 11-11, 11-12, 11-21, 11-22, for data storage (called "real cells") are respectively positioned at intersecting points of the word lines WLm, WLn, . . . , the first bit lines BL11, BL12, and the second bit lines BL21, BL22, . . . so as to form a matrix pattern. Each of the memory cells 11-11, 11-12, 11-21, 11-22, includes a MOS transistor. First electrodes of the MOS transistors, e.g., sources, are connected to the first bit lines BL11, BL12, . . . , second electrodes of the MOS transistors, e.g., drains, are connected to the second bit lines BL21, BL22, . . . , and floating gates of the MOS transistors are connected to the word lines WLm, WLn, . . . . A plurality of second memory cells 11-31, 11-32, . . . for reference data storage (called "reference cells") are respectively positioned at intersecting points of the word lines WLm, WLn, . . . , the third bit line BL3 and the fourth bit line BL4. Each of the memory cells 11-31, 11-32, . . . includes a MOS transistor. First electrodes of the MOS transistors, e.g., sources, are connected to the third bit line BL3, second electrodes of the MOS transistors, e.g., drains, are connected to the fourth bit line BL4, and floating gates of the MOS transistors are respectively connected to the word lines WLm, WLn, . . . .

The word lines WLm, WLn, . . . are connected to an address decoder via, for example, respective word line driving circuits. An external address is decoded by the address decoder, and then the decoded signal is processed by the word line driving circuit so as to selectively drive one of the word lines WLm, WLn, . . . with a driving signal, e.g., the VCC. One ends of the first bit lines BL11, BL12, . . . and the third bit line BL3 are, for example, connected to a pull-up circuit for supplying the VCC to the bit lines. One ends of the second bit lines BL21, BL22, . . . , i.e., nodes H, are connected to the GND via N-channel MOS transistors (hereinafter referred to as NMOSs) 12-1, 12-2, . . . , to which signals Yn, Ym, . . . decoded by an external address input are gate-input. The signals Yn, Ym, . . . are generated by, for example, the respective bit line driving circuits which drive output signals from the address decoder which decodes the external address. One end of the fourth bit line BL4 is connected to the GND via an NMOS 13 which is at a normally on state by the VCC applied on the gate.

Because of the increase of the lengths of the bit lines BL11, BL12, BL21, BL22, . . . , BL3 and BL4 caused by the capacity increase of the EPROM, parasitic capacitances 14 are generated between the first bit lines BL11, BL12, and the second bit lines BL21, BL22, . . . , respectively, as well as between the third bit line BL3 and the fourth bit line BL4.

The other ends of the first bit lines BL11, BL12, . . . are commonly connected to an input node A, and the input node A is connected to the real cell amplifier 20. The other end of the third bit line BL3 is connected to the reference amplifier 30 via an input node B.

The real cell amplifier 20 includes an amplification circuit 21 of a current mirror configuration for receiving a voltage of the input node A, and a constant voltage circuit 22 controlled by a first output node C of the amplification circuit 21. The amplification circuit 21 amplifies an electrical potential of the input node A and outputs the amplified potential from the first output node C in response to a control signal AE, which is, for example, the VCC when the real cell amplifier 20 is required to be in an operable condition. The amplification circuit 21 includes a first transistor 21a for loading, e.g., a P-channel MOS transistor (hereinafter referred to as a PMOS), a second transistor 21b for loading, e.g., a PMOS, a third transistor 21c for input, e.g., an NMOS, a fourth transistor 21d for input, e.g., an NMOS, and a transistor 21e for on/off operation, e.g., an NMOS.

As for the PMOS 21a, a first control electrode, e.g., a gate, is connected to a second control electrode, e.g., a gate, of the PMOS 21b, a first electrode, e.g., a source, is connected to the VCC node, and a second electrode, e.g., a drain, is connected to the first output node C. As for the PMOS 21b, a third electrode, e.g., a source, is connected to the VCC node, and a fourth electrode, e.g., a drain, is connected to the gate of its own. As for the NMOS 21c, a third control electrode, e.g., a gate, is connected to the input node A, a fifth electrode, e.g., a source, is connected to a seventh electrode, e.g., a source, of the NMOS 21d, and a sixth electrode, e.g., a drain, is connected to the first output node C. As for the NMOS 21d, the intermediate electrical potential REF is input to a fourth control electrode, e.g., a gate, and an eighth electrode, e.g., a drain, is connected to the drain and the gate of the PMOS 21b. The sources of the NMOSs 21c and 21d are commonly connected to a drain of the NMOS 21e. As for the NMOS 21e, the control signal AE is input to a gate, and a source is connected to the GND.

The constant voltage circuit 22 stabilizes an electrical potential of the first output node C, and outputs the stabilized potential from the second output node E. The constant voltage circuit 22 includes a fifth transistor 22a for loading, e.g., a PMOS, a sixth transistor 22b, e.g., an NMOS, and a pull-down element 22c, e.g., an NMOS as a seventh transistor. As for the PMOS 22a, a fifth control electrode, e.g., a gate, is connected to the second output node E, a ninth electrode, e.g., a source, is connected to the VCC node, and a tenth electrode, e.g., a drain, is connected to the gate of its own and to a twelfth electrode, e.g., a drain, of the NMOS 22b. As for the NMOS 22b, a sixth control electrode, e.g., a gate, is connected to the first output node C, and an eleventh electrode, e.g., a source, is connected to the input node A. The diode-connected NMOS 22c is provided between the input node A and the GND. Specifically, as for the NMOS 22c, a seventh control electrode, e.g., a gate, is connected to a fourteenth electrode, e.g., a drain of its own, and a thirteenth electrode, e.g., a source, is connected to the GND, and the drain is connected to the input node A. A gate length and a gate width of the transistor of the NMOS 22c are adjusted so as to have a higher resistance.

The reference amplifier 30 includes an amplification circuit 31 of a current mirror configuration for receiving a voltage of the input node B, and a constant voltage circuit 32 controlled by a first output node D of the amplification circuit 31. The reference amplifier 30 consists of the same elements as the real cell amplifier 20 other than the PMOSs 32a-1 and 32a-2 for loading within the constant voltage circuit 32, having dimensions several times, e.g., twice, bigger than that of the corresponding PMOS 22a for loading within the constant voltage circuit 22. Specifically, the amplification circuit 31 amplifies an electrical potential of the input node B and outputs the amplified potential from the first output node D in response to the control signal AE. The amplification circuit 31 includes a PMOS 31a for loading, a PMOS 31b for loading, an NMOS 31c for input which is gate-controlled by the input node B, an NMOS 31d for input which is gate-controlled by the intermediate electrical potential REF, and an NMOS 31e for on/off operation which is gate-controlled by the control signal AE. The constant voltage circuit 32 stabilizes the electrical potential of the first output node D, and outputs the stabilized potential from the second output node F. The constant voltage circuit 32 includes PMOSs 32a-1 and 32a-2 for loading, an NMOS 32b which is gate-controlled by the first output node D, and a pull-down element 32c, e.g., an NMOS.

The output node E of the real cell amplifier 20 and the output node F of the reference amplifier 30 are connected to the sense amplifier 40. The sense amplifier 40 differentially amplifies electrical potentials of the output node E and the output node F, and outputs an output signal OUT as a reading signal. The sense amplifier 40 is formed by an inverting differential amplification circuit of a current mirror configuration. Specifically, the sense amplifier 40 includes a PMOS 41 which is gate-controlled by the output node E, a PMOS 42 which is gate-controlled by the output node F, an NMOS 43 for loading, an NMOS 44 for loading, an NMOS 45 which is gate-controlled by the control signal AE which is, for example, the VCC when the sense amplifier 40 is required to be in an operable condition, a buffer 46, and an output terminal 47 for outputting the output signal OUT. The PMOS 41 and the NMOS 43 are connected in series to the VCC, and the PMOS 42 and the NMOS 44 are also connected in series to the VCC. The gate of the NMOS 43 is connected to the gate and the drain of the NMOS 44. The source of the NMOS 43 and the source of the NMOS 44 are commonly connected to the drain of the NMOS 45, and the source of the NMOS 45 is connected to the GND. The drain of the PMOS 41 and the drain of the NMOS 43 are connected to the output terminal 47 via the buffer 46.

Writing Operation

The data '0' is written to the memory cell 11-11 in, for example, the following procedures. Firstly, the word line WLn is decoded by the external address input, and a high voltage VPP for writing, e.g., 10V, supplied from a high voltage generation circuit (not shown) is applied to the word line WLn. Secondly, a signal Yn decoded by the external address input drops to the 'L' level so as to make the NMOS 12-1 in the off state, and thus a control voltage MCD, e.g., 6V, supplied from a writing control circuit (not shown) is applied to the bit line BL21. Finally, data '0', e.g., 0V, is input from a data writing circuit (not shown) to the bit line BL11 which is decoded by the external address input. Consequently, in the selected memory cell 11-11, the high voltage VPP (=10V) is applied to the control gate, the control voltage MCD (=6V) is applied to the drain, and 0V is applied to the source, resulting in a voltage of 10V across the control gate and the source, and a voltage of 6V across the drain and the source. The above voltage generates a strong electrical field which accelerates a part of electrons flowing between the drain and the source, so that the part of the electrons obtains energy and jumps an energy barrier of a gate insulation film. Accordingly, the part of the electrons is injected to the floating gate, which achieves the writing of the data '0'.

On the other hand, the data '1' is written to the memory cell 11-12 in, for example, the following procedures. Firstly, the word line WLm is decoded by the external address input, and the high voltage VPP for writing (=10V) supplied from the high voltage generation circuit (not shown) is applied to the word line WLm. Secondly, the NMOS 12-1 is made in the off state by the signal Yn (='L' level) decoded by the external address input, and thus the control voltage MCD (=6V) supplied from the writing control circuit (not shown) is applied to the bit line BL21. Finally, data '1', e.g., VCC−Vtn=3V where Vtn denotes a threshold voltage of the NMOS, is input from the data writing circuit (not shown) to the bit line BL11 which is decoded by the external address input. Consequently, in the selected memory cell 11-12, the high voltage VPP (=10V) is applied to the control gate, the control voltage MCD (=6V) is applied to the drain, and 3V is applied to the source, resulting in a voltage of 7V across the control gate and the source, and a voltage of 3V across the drain and the source. In this instance, energy of electrons flowing between the drain and the source is too small to be injected to the floating gate. This means the writing of the data '1' is made.

Reading Operation

Figure 2:
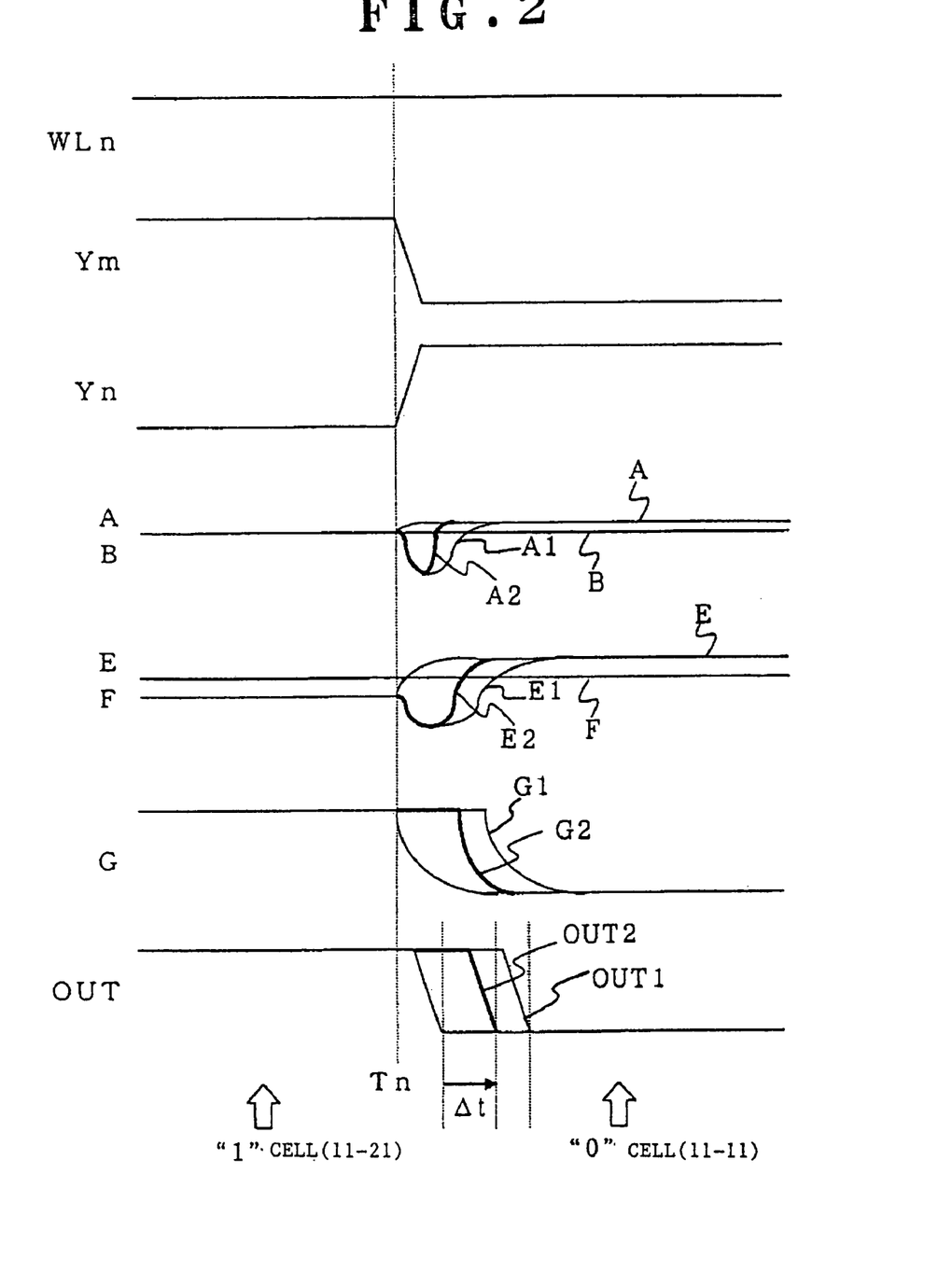
FIG. 2 is a voltage waveform chart showing an operation of the circuit in FIG. 1.

FIG. 2 is a voltage waveform chart illustrating a reading operation of the EPROM in FIG. 1, where the abscissa represents time and the ordinate represents voltage.

The reading operation of the real cell of FIG. 1 during a shift from a reading operation of the '1' cell (the memory cell 11-21) to a reading operation of the '0' cell (the memory cell 11-11) will be described hereinbelow on the basis of either (1) without the NMOSs 22c and 32c or (2) with the NMOSs 22c and 32c. The shift is achieved by a switch of the signal from Ym to Yn at the time Tn under the condition that, for example, the word line WLn is selected (WLn=VCC=4V).

In this instance, the '1' cell is in the state that no electron is injected to the floating gate of the memory cell 11-21. Therefore, when the gate (the word line WLn) of the memory cell 11-21 is selected and an electrical potential difference is generated between the source and the drain, a channel is formed so as to generate an electrical current flow. Since the memory cell is generally manufactured to have high resistance in order to reduce the electrical power consumption, the amount of the electrical current flowing through the channel is very small. On the contrary, the '0' cell is in the state that the electrons are injected to the floating gate of the memory cell 11-11. Therefore, when the gate (the word line WLn) of the memory cell 11-11 is selected and an electrical potential difference is generated between the source and the drain, no channel is formed thereby generating no electrical current flow. It should be noted that the memory cells 11-31, 11-32, . . . , which are the reference cells, are all '1' cells, and thus the '0' cell exists only in the real cell region.

(1) Reading Operation Without the NMOSs 22c and 32c

Before a time Tn, the control signal AE is the VCC level, and thus the NMOS 21e within the real cell amplifier 20, the NMOS 31e within the reference amplifier 30 and the NMOS 45 within the sense amplifier 40 are in on states. Therefore, the real cell amplifier 20, the reference amplifier 30 and the sense amplifier 40 are in the operable conditions.

With respect to the '1' reference cells, the word line WLn is decoded to, e.g., WLn=VCC=4V, by the external address input, and thus the memory cell 11-31 is selected. In the memory cell 11-31, since the drain side is at the GND level (=0V) via the bit line BL4 and NMOS 13, an electrical potential difference is generated between the source and the drain. Accordingly, a channel is formed so as to generate an electrical current flow. Consequently, en electrical potential of the input node B is decreased via the bit line BL3, and an on-resistance value between the source and the drain of the NMOS 31c within the reference amplifier 30 is increased.

When the on-resistance value of the NMOS 31c is increased, an electrical current flowing through the NMOS 31c tends to decrease. However, due to the current mirror effect, the same electrical current as that flowing through the PMOS 31b and the NMOS 31d flows through the PMOS 31a and the NMOS 31c, and therefore, an electrical potential of the output node D on the drain side of the NMOS 31c is increased. When the electrical potential of the output node D is increased, an on-resistance value of the NMOS 32b is decreased, and thus an electrical current flowing through a route via the VCC, the PMOSs 32a-1 and 32a-2, the NMOS 32b, and the input node B is increased. Accordingly, an electrical potential of the input node B is increased so as to always be kept in the vicinity of the intermediate electrical potential REF. Further, an electrical potential of the output node F of the constant voltage circuit 32 is kept to the predetermined intermediate electrical potential based on the electrical potential of the output node B.

With respect to the real cells, the word line WLn is decoded to, e.g., WLn=VCC=4V, by the external address input, and the signal Ym decoded by the external address input becomes the VCC so as to make the NMOS 12-2 in the on state. Therefore, the memory cell 11-21, i.e., the '1' cell, is selected. In the memory cell 11-21, an electrical potential of the drain (the bit line LB22) is reduced to the GND level (0V) via the NMOS 12-2, and thus an electrical potential difference is generated between the source and the drain. Accordingly, a channel is formed so as to generate an electrical current flow. Consequently, an electrical potential of the input node A is decreased via the bit line BL12, and thus an on-resistance value between the source and the drain of the NMOS 21c within the real cell amplifier 20 is increased.

When the on-resistance value of the NMOS 21c is increased, an electrical current flowing through the NMOS 21c tends to decrease. However, due to the current mirror effect, the same electrical current as that flowing through the PMOS 21b and the NMOS 21d flows through the PMOS 21a and the NMOS 21c, and therefore, an electrical potential of the output node C of the drain of the NMOS 21c is increased.

When the electrical potential of the output node C is increased, the on-resistance value of the NMOS 22b is decreased, and thus an electrical current flowing through a route via the VCC, the PMOS 22a, the NMOS 22b, and the input node A is increased. Accordingly, an electrical potential of the input node A is increased so as to establish the same potential as the input node B on the reference amplifier 30 side. An electrical potential of the output node E of the constant voltage circuit 22 is slightly lower than that of the output node F, because the dimension of the PMOS 22a within the constant voltage circuit 22 is a half as compared with the dimensions of the PMOSs 32a-1 and 32a-2 within the reference amplifier 30.

The electrical potentials of the output node E and the output node F are applied to the sense amplifier 40. In the sense amplifier 40, an electrical potential difference between the node E and the node F is amplified by the PMOSs 41 and 42, and the NMOSs 43 and 44 so as to output an electrical potential of inverted level, e.g., an electrical potential in the vicinity of the VCC, from the node G. The output voltage is buffered by the buffer 46, and then an output signal OUT on the VCC level is output from the output terminal 47.

On the time Tn, the signal Ym is shifted from the 'H' level to the 'L' level, and the signal Yn is shifted from the 'L' level to the 'H' level, and thus the NMOS 12-2 is turned to the off state and the NMOS 12-1 is turned to the on state. Accordingly, the memory cell 11-11 of the real cell '0' is selected. In the memory cell 11-11, an electrical potential of the drain is reduced to the GND level (=0V) via the node H and the NMOS 12-1 on the bit line BL21. Although an electrical potential difference is generated between the source and the drain, no channel is formed thereby generating no electrical current flow. In the meantime, since the parasitic capacitance 14 exists between the bit line BL11 and the bit line BL21, the node A is influenced by the coupling effect of the node H, and thus an electrical current i flows through the parasitic capacitance 14. Accordingly, the electrical potential of the node A is momently reduced to the GND level as shown by a waveform of node A1 in FIG. 2. This reduction affects the node E1 and the node G1, and finally causes a delay of a reading access time by Δt in the output signal OUT1. Since the time Δt is in proportion to an amount of the parasitic capacitance 14, increased lengths of the bit lines BL11, BL21, . . . caused by the capacity increase of the EPROM elongtes the delay time.

Subsequently, the parasitic capacitance 14 is charged by the operation of the real cell amplifier 20, and the waveform of the input node Al rises. Since no channel is formed in the memory cell 11-11, and no electrical current flow is generated, the electrical potential of the node A is slightly higher than that of the input node B of the reference amplifier 30. Accordingly, a voltage slightly higher than that of the output node F of the reference amplifier 30 side is output from the output node E and supplied to the sense amplifier 40. An electrical potential difference between the output node E and the output node F is then inverted and amplified in the sense amplifier 40, and then an electrical potential at the vicinity of the GND level is output from the node G. This output voltage is buffered by the buffer 46, and then an output signal of the GND level is output from the output terminal 47.

In the afore-described reading operation, the reading access time is delayed by Δt due to the parasitic capacitance 14. In order to decrease the delay time Δt, the NMOSs 22c and 32c are provided in the first embodiment which will be described hereinbelow.

(2) Reading Operation with the NMOSs 22c and 32c

Figure 3:
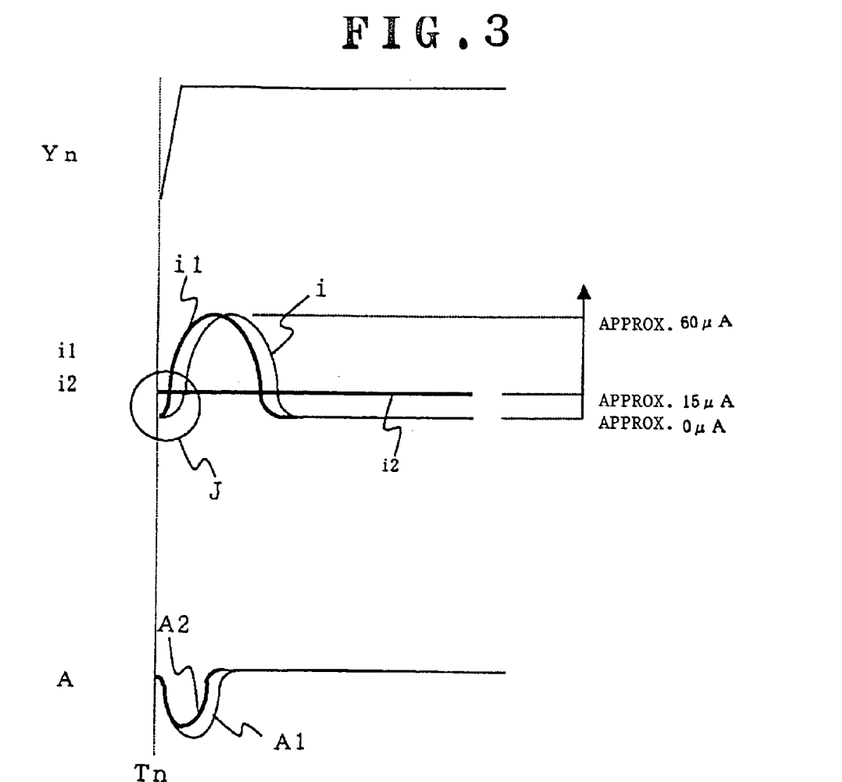
FIG. 3 is an electrical current and voltage waveform chart during a transition period after a time Tn shown in FIG. 2.

FIG. 3 is an electrical current and voltage waveform chart during a transition period after the time Tn of FIG. 2, where the abscissa represents time and the ordinate represents electrical current and voltage.

In the reading operation of the real cell '0' at the time Tn, when the electrical potential of the node A is higher than the threshold voltage Vtn of the NMOS 22c under the influence of the coupling effect of the parasitic capacitance 14, a minute electrical current i2 flows from the node A to the GND via the high resistance NMOS 22c in addition to an electrical current i1 flowing from the node A which charges the parasitic capacitance 14.

Specifically, as shown in FIG. 3, when the electrical potential of the node A is dropped by the coupling effect of the parasitic capacitance 14, an electrical current i flowing to the parasitic capacitance 14, i.e., a charging current i1, exhibits a peak value of an approximately 60 µA, and an electrical current i2 flowing to the GND via the NMOS 22c, i.e., a direct current, exhibits a value of an approximately 15 µA. If the NMOS 22c is not provided, the drop of the electrical potential of node A such as a waveform of the node A1 is detected by the amplification circuit 21, and then the detection result is transferred to the constant voltage circuit 22. Eventually, an electrical current i starts flowing and charges the parasitic capacitance 14. On the contrary, when the high resistance NMOS 22c is provided, the electrical current i2 always flows through the node A, and therefore, as shown in a rising section J in FIG. 3, the electrical charging starts earlier than that of the electrical current i. Furthermore, since an electrical current (i1+i2) from the node A has an increased amount, an electrical current supplying capacity of the constant voltage circuit 22 is increased. Accordingly, as shown in a waveform of the node A2 in FIG. 3, the electrical potential of the node A can quickly return to a desired level, and thus the subsequent reading delay time Δt can be decreased.

Since the NMOS 22c and the NMOS 32c have the higher resistances due to the gate inputs of the intermediate potential and the dimensions of the transistors, the electrical potentials of the node A and the node B are approximately the same as those of the node A and the node B without having the NMOS 22c and the NMOS 32c. In the reference amplifier 30, since a minute electrical current flows from the node B to the GND via the NMOS 32c, the node B has the same electrical potential as the node A during the reading operation of the '1' cell, which is similar to the case without having the NMOS 22c and the NMOS 32c.

According to the first embodiment, a path of the direct current i2 from the node A to the GND via the NMOS 22c is provided in addition to a path of the electrical current i1 which charges the parasitic capacitance 14 of node A when the node A is influenced by the coupling effect of the parasitic capacitance 14 during the reading operation of the '0' cell. Accordingly, the electrical charge starts earlier, and the electrical current supplying capacity of the constant voltage circuit 22 within the real cell amplifier 20 is enhanced. Consequently, the electrical potential of the node A can quickly return to a desired level, and thus the subsequent reading delay time Δt can be decreased.

Second Embodiment

Figure 4:
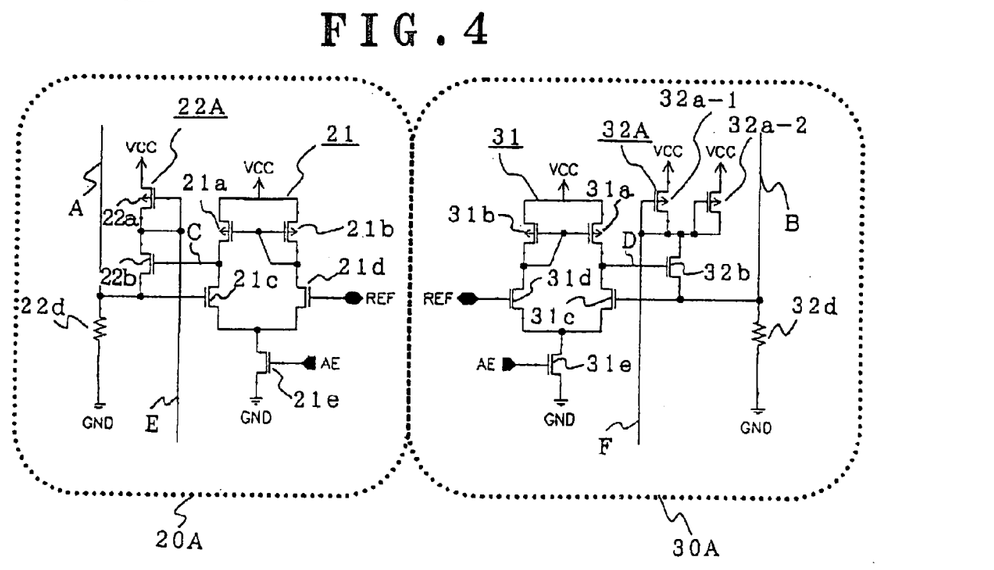
FIG. 4 is a circuit diagram of a real cell amplifier and a reference amplifier within an EPROM showing a second embodiment of the present invention.

FIG. 4 is a circuit diagram of a real cell amplifier and a reference amplifier within an EPROM showing a second embodiment of the present invention. In FIG. 4, the same reference numerals and symbols are assigned for the same elements as those used in FIG. 1 of the first embodiment.

The second embodiment differs from the first embodiment in that a real cell amplifier 20A and a reference amplifier 30A are provided instead of the real cell amplifier 20 and the reference amplifier 30 of the first embodiment. The amplifiers 20A and 30A have different structures, as compared with the amplifiers 20 and 30.

The real cell amplifier 20A includes an amplification circuit 21 having PMOSs 21a and 21b, and NMOSs 21c, 21d and 21e which are similar to the first embodiment, and a constant voltage circuit 22A which has a different structure from the first embodiment. The constant voltage circuit 22A includes a PMOS 22a and an NMOS 22b which are similar to the first embodiment, and a resistor element 22d having a high resistance instead of the NMOS 22c of the first embodiment. As for the PMOS 22a, a source is connected to the VCC, and a drain and a gate are connected to the second output node E. As for the NMOS 22b, a drain is connected to the drain of the PMOS 22a, a source is connected to the input node A, and a gate is connected to the first output node C of the amplification circuit 21. The resistor element 22d is connected between a connection point of the node A and the source of the NMOS 22b, and the GND.

The reference amplifier 30A includes an amplification circuit 31 having PMOSs 31a and 31b, and NMOSs 31c, 31d and 31e which are similar to the first embodiment, and a constant voltage circuit 32A which has a different structure from the first embodiment. The constant voltage circuit 32A includes PMOSs 32a-1 and 32a-2, and an NMOS 32b which are similar to the first embodiment, and a resistor element 32d having a high resistance instead of the NMOS 32c of the first embodiment. As for the PMOSs 32a-1 and 32a-2, sources are connected to the VCC, and drains and gates are connected to the second output node F. As for the NMOS 32b, a drain is connected to the drains of the PMOSs 32a-1 and 32a-2, a source is connected to the input node B, and a gate is connected to the first output node D of the amplification circuit 31. The resistor element 32d is connected between a connection point of the node B and the source of the NMOS 32b, and the GND. The other structures are similar to those of the first embodiment.

The writing operation is the same as that of the first embodiment.

In the reading operation, when the electrical potential of the node A is influenced by the coupling effect of the parasitic capacitance 14 during the reading operation of the real cell '0', a minute electrical current i2 flows from the node A to the GND via the resistor element 22d having the high resistance, in addition to an electrical current i1 flowing from the node A for charging the parasitic capacitance 14. The above feature is substantially the same as the first embodiment. Since the resistor element 22d and the resistor element 32d have the higher resistances, the electrical potentials of the node A and the node B are approximately the same as those of the node A and the node B without having the resistor element 22d and the resistor element 32d. In the reference amplifier 30A, since a minute electrical current flows from the node B to the GND via the resistor element 32d, the node B has the same electrical potential as that of the node A during the reading operation of the '1' cell, which is similar to the case without having the resistor element 22d and the resistor element 32d.

According to the second embodiment, similar to the first embodiment, a path of the direct current i2 from the node A to the GND via the resistor element 22d is provided in addition to a path of the electrical current i1 which charges the parasitic capacitance 14 of the node A when the node A is influenced by the coupling effect of the parasitic capacitance 14 during the reading operation of the '0' cell. Accordingly, the electrical charging starts earlier, and the electrical current supplying capacity of the constant voltage circuit 22A within the real cell amplifier 20A is increased. Consequently, the electrical potential of the node A can quickly return to a desired level, and thus the subsequent reading delay time Δt can be decreased.

Furthermore, as compared with the first embodiment, the path of the direct current i2 exists even though the electrical potential of the node A is lower than the threshold voltage Vtn of the NMOS, resulting in a decrease of the delay time Δt regardless of the electrical potential of the node A.

Third Embodiment

Figure 5:
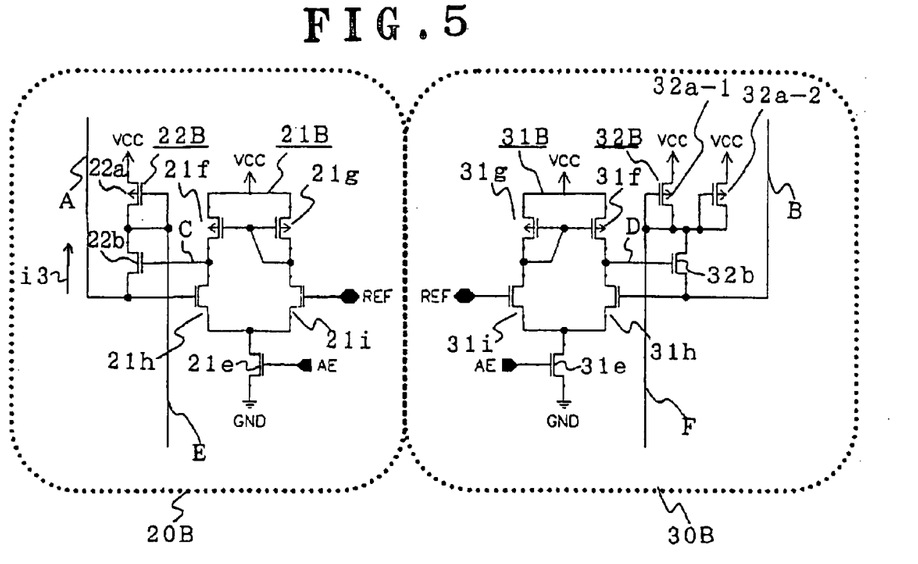
FIG. 5 is a circuit diagram of a real cell amplifier and a reference amplifier within an EPROM showing a third embodiment of the present invention.

FIG. 5 is a circuit diagram of a real cell amplifier and a reference amplifier within an EPROM showing a third embodiment of the present invention. In FIG. 5, the same reference numerals and symbols are assigned for the same elements as those used in FIG. 1 of the first embodiment.

The third embodiment differs from the first embodiment in that a real cell amplifier 20B and a reference amplifier 30B are provided instead of the real cell amplifier 20 and the reference amplifier 30 of the first embodiment. The amplifiers 20B and 30B have different structures, as compared with the amplifiers 20 and 30.

The real cell amplifier 20B includes an amplification circuit 21B having transistors of different dimensions from the first embodiment, and a constant voltage circuit 22B having a PMOS 22a and an NMOS 22b but omitting the NMOS 22c of the first embodiment. The amplification circuit 21B includes, as similar to the first embodiment, a first transistor PMOS 21f, a second transistor PMOS 21g, a third transistor NMOS 21h, a fourth transistor NMOS 21i, and an NMOS 21e for on/off operation. The dimension of the PMOS 21f is n times as large as that of the PMOS 21g, and the dimension of the NMOS 21g is n times as large as that of the NMOS 21i, where n denotes an arbitrary number more than 1.

As for the PMOS 21f, a gate is connected to a gate of the PMOS 21g, a source is connected to the VCC node, and a drain is connected to the first output node C. As for the PMOS 21g, a source is connected to the VCC node, and a drain is connected to a gate of its own. As for the NMOS 21h, a gate is connected to the input node A, a source is connected to a source of the NMOS 21i, and a drain is connected to the first output node C. As for the NMOS 21i, the intermediate potential REF is input to a gate, and a drain is connected to the drain and the gate of the PMOS 21g. The sources of the NMOSs 21g and 21i are commonly connected to a drain of the NMOS 21e. As for the NMOS 21e, the control signal AE is input to a gate, and a source is connected to the GND.

The reference amplifier 30B has a similar structure to the real cell amplifier 20B. The reference amplifier 30B includes an amplification circuit 31B having transistors of different dimensions from the first embodiment, and a constant voltage circuit 32B having PMOSs 32a-1 and 32a-2, and an NMOS 32b but omitting the NMOS 32c of the first embodiment. The amplification circuit 31B includes, as similar to the first embodiment, a first transistor PMOS 31f, a second transistor PMOS 31g, a third transistor NMOS 31h, a fourth transistor NMOS 31i, and an NMOS 31e for on/off operation. However, the dimension of the PMOS 31f is n times as large as that of the PMOS 31g, and the dimension of the NMOS 31g is n times as large as that of the NMOS 31i.

As for the PMOS 31f, a gate is connected to a gate of the PMOS 31g, a source is connected to the VCC node, and a drain is connected to the first output node D. As for the PMOS 31g, a source is connected to the VCC node, and a drain is connected to a gate of its own. As for the NMOS 31h, a gate is connected to the input node B, a source is connected to a source of the NMOS 31i, and a drain is connected to the first output node D. As for the NMOS 31i, the intermediate potential REF is input to a gate, and a drain is connected to the drain and the gate of the PMOS 31g. The sources of the NMOSs 31g and 31i are commonly connected to a drain of the NMOS 31e. As for the NMOS 31e, the control signal AE is input to a gate, and a source is connected to the GND.

Figure 6:
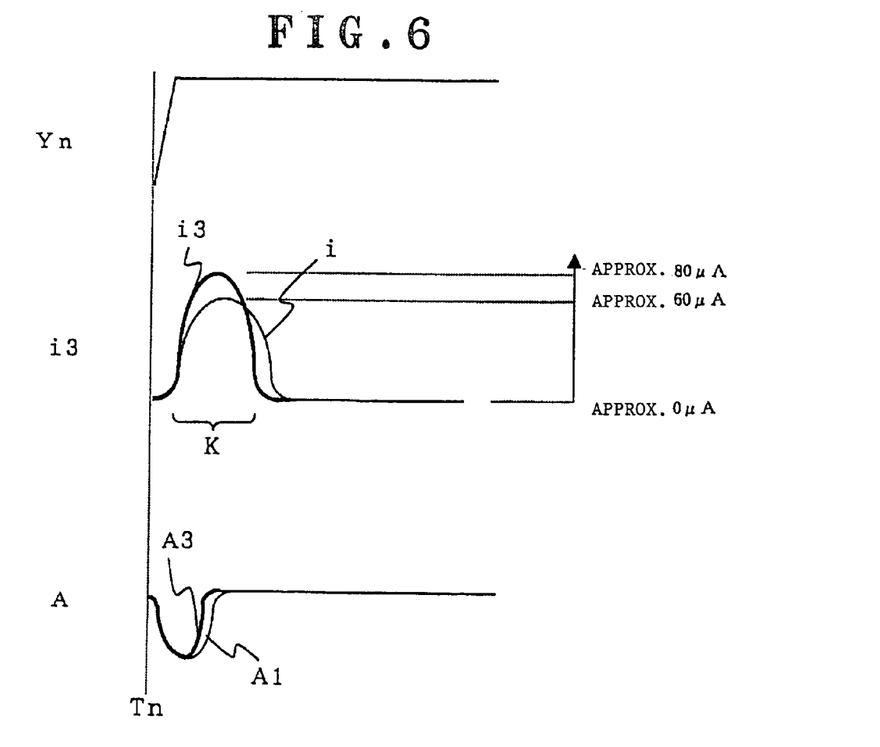
FIG. 6 is an electrical current and voltage waveform chart, corresponding to the chart of FIG. 3, of the circuit of FIG. 5 during a transition period after a time Tn.

FIG. 6 is an electrical current and voltage waveform chart, corresponding to the chart of FIG. 3, during a transition period after the time Tn in FIG. 5, where the abscissa represents time and the ordinate represents electrical current and voltage.

The writing operation is the same as that of the first embodiment.

In the reading operation, when the electrical potential of the node A is influenced by the coupling effect of the parasitic capacitance 14 during the reading operation of the real cell '0', an electrical current i3 flows from the node A for charging the parasitic capacitance 14. The above feature is substantially the same as the first embodiment.

Specifically, as shown in FIG. 6, when the electrical potential of the node A is dropped by the coupling effect of the parasitic capacitance 14, the on-resistance value of the NMOS 21g is increased, resulting in a decrease of an electrical current flowing through the NMOS 21h. However, due to the current mirror effect, an electrical current having a value n times as large as that flowing through the PMOS 21g and the NMOS 21i flows through the PMOS 21f and the NMOS 21h, and therefore an electrical potential of the output node C on the drain side of the NMOS 21g is quickly increased. When the electrical potential of the output node C is increased, an on-resistance value of the NMOS 22b is decreased, and thus, as shown in a rising section K of FIG. 6, an electrical current i3 flowing through a route via the VCC, the PMOS 22a, the NMOS 22b and the input node A is suddenly increased (a peak value is approximately 80 μA). Accordingly, the parasitic capacitance 14 is charged in a short period. Subsequently, as shown in a waveform of a node A3, the electrical potential of the node A quickly increases and returns to a desired level.

According to the third embodiment, a dimension ratio of the PMOS 21f and the NMOS 21g to the PMOS 21g and the NMOS 21i is set at n:1, whereas the dimension ratio of the first embodiment is 1:1 when the NMOS 22c is not provided, and a dimension ratio of the PMOS 31f and the NMOS 31g to the PMOS 31g and the NMOS 31i is set at n:1, whereas the dimension ratio of the first embodiment is 1:1 when the NMOS 32c is not provided. Accordingly, in the first embodiment, the charging current i flowing to the input node A without the NMOS 22c has the peak value of approximately 60 μA as shown in the rising section K in FIG. 6, and then the electrical potential of the node A gradually rises as shown in the waveform of the node A1 so as to return to the desired level. On the contrary, in the third embodiment, the peak value of the charging current i3 is higher than the peak value of the charging current i, and the charging time is much shorter, and therefore, a response rate of the real cell amplifier 20B is improved so that the node A can quickly return to the desired level as shown in the waveform of the node A3, and the subsequent reading delay time Δt can be decreased.

Similarly, in the reference amplifier 30A, an electrical current flowing through the PMOS 31f and the NMOS 31g on the node B side is approximately n times as large as that flowing through the PMOS 31g and the NMOS 31i on the intermediate potential REF side, and therefore the electrical potential of the node B is the same as that of the node A during the reading operation of the '1' cell, which is similar to the case without the NMOSs 22c and 32c of the first embodiment.

According to the third embodiment, in the amplification circuit 21B within the real cell amplifier 20B, the dimension ratio of the PMOS 21f and the NMOS 21g to the PMOS 21g and the NMOS 21i is set at n:1. Similarly, in the amplification circuit 31B within the reference amplifier 30B, the dimension ratio of the PMOS 31f and the NMOS 31g to the PMOS 31g and the NMOS 31i is set at n:1. Therefore, the electrical current on the node A side is increased, and the response rate of the real cell amplifier 20B is improved so that the charging time to the node A is decreased. Accordingly, the node A can quickly return to the desired level when the node A is influenced by the coupling effect of the parasitic capacitance 14 during the reading operation of the '0' cell, and the subsequent reading delay time Δt can be decreased.

In addition, it is not necessary to provide the NMOSs 22c and 32c of the first embodiment, and the resistor elements 22d and 32d of the second embodiment. Accordingly, the third embodiment has an advantage in view of a decreased layout area in developing an integrated circuit.

It should be noted that the above-described first through third embodiments are mere examples of the present invention. Therefore, the scope of the present invention should not be narrowly interpreted as only the above-described first through third embodiments, and a person skilled in the art can make various changes and modifications without departing from the sprit and scope of the present invention.

The following modifications (a) and (b) can be made, for example.

(a) The memory cell block 10 may be replaced with any other suitable cell block.

(b) The structures of the real cell amplifiers 20, 20A and 20B, the reference amplifiers 30, 30A and 30B, and the sense amplifier 40 may be replaced with any other suitable amplifiers as long as they have similar functions.

According to the first through third embodiments, the descriptions are made based on the EPROM. However, the present invention is not limited to the EPROM. The present invention may be applied to another semiconductor storage devices such as a nonvolatile memory that can be electrically erased in a single action and electrically written in a single action, i.e., an EEPROM.

In the first through third embodiments, the real cell amplifiers 20, 20A and 20B, and the reference amplifiers 30, 30A and 30B are used for the reading circuits of the EPROM. The present invention may be applied to various semiconductor devices which need to suppress an influence by a noise of an input signal caused by the use of the amplifiers.

This application is based on a Japanese patent application No. 2003-281117, the entire disclosure of which is incorporated herein by reference.

What is claimed is:

1. An amplifier comprising:
   an input node being shifted from a first power supply potential to a second power supply potential during a first mode in response to a selection signal, and for being maintained at the first power supply potential during a second mode;
   an amplification circuit connected to the input node for amplifying an electrical potential of the input node and outputting the amplified potential from a first output node in response to a control signal, the amplification circuit including:
     a first transistor having a first control electrode, a first electrode connected to a first power supply potential node or a second power supply potential node, and a second electrode connected to the first output node,
     a second transistor having a second control electrode connected to the first control electrode, a third electrode connected to the first power supply potential node or the second power supply potential node, and a fourth electrode connected to the second control electrode,
     a third transistor having a third control electrode connected to the input node, a fifth electrode connected to the second power supply potential node or the first power supply potential node, and a sixth electrode connected to the first output node, and
     a fourth transistor having a fourth control electrode applied an intermediate electrical potential between the first power supply potential and the second power supply potential, a seventh electrode connected to the second power supply potential node or the first power supply potential node, and an eighth electrode connected to the fourth electrode; and
   a constant voltage circuit connected to the first output node for stabilizing the electrical potential of the first output node and outputting the stabilized potential from a second output node, the constant voltage circuit including:
     a fifth transistor having a fifth control electrode connected to the second output node, a ninth electrode connected to the first power supply potential node, and a tenth electrode connected to the fifth control electrode,
     a sixth transistor having a sixth control electrode connected to the first output node, an eleventh electrode connected to the input node, and a twelfth electrode connected to the tenth electrode, and
     a pull-down element connected between the input node and the second power supply potential node.

2. The amplifier according to claim 1, wherein the pull-down element includes a seventh transistor having a seventh control electrode connected to the input node, a thirteenth electrode connected to the second power supply potential node, and a fourteenth electrode connected to the seventh control electrode.

3. The amplifier according to claim 1, wherein the pull-down element includes a resistor element connected between the input node and the second power supply potential node.

4. A semiconductor storage device using the amplifier according to claim 1, the semiconductor storage device comprising:
   a plurality of word lines arranged in parallel to each other so as to be decoded by an external address input;

a plurality of first bit lines arranged in parallel to each other and having predetermined spaces therebetween, the first bit lines extending perpendicular to the word lines;

a plurality of second bit lines respectively arranged beside the first bit lines so as to define a plurality of pairs of first and second bit lines, the second bit lines being parallel with the first bit lines and connected to the second power supply potential node of claim 1 in response to the selection signal of claim 1 decoded by an address input;

a third bit line arranged in parallel with the second bit lines;

a fourth bit line arranged beside the third bit line so as to define a pair of third and fourth bit lines, the fourth bit line being parallel with the third bit line and connected to the second power supply potential node;

a plurality of first memory cells respectively positioned at intersecting points of the word lines, and the pairs of first and second bit lines so as to form a matrix pattern, each said first memory cell including a first electrode connected to the first bit line concerned, a second electrode connected to the second bit line paired with the first bit line concerned, and a floating gate connected to the word line concerned;

a plurality of second memory cells respectively positioned at intersecting points of the word lines, and the pair of third and fourth bit lines, each said second memory cell including a first electrode connected to the third bit line, a second electrode connected to the fourth bit line, and a floating gate connected to the word line concerned;

an amplifier of claim 1 commonly connected to one ends of the first bit lines;

a reference amplifier connected to one end of the third bit line for amplifying an electrical potential of the one end of the third bit line and outputting the amplified potential to an output node in response to the control signal of claim 1, and the reference amplifier including an amplifying circuit which is the same as the amplification circuit of claim 1, and a constant voltage circuit formed by a transistor having a dimension multiple times as large as that of the fifth transistor of claim 1, a transistor identical to the sixth transistor of claim 1, and a pull-down element identical to the pull-down element of claim 1; and a differential amplifier connected to a second output node of the amplifier and an output node of the reference amplifier for amplifying a difference between an electrical potential of the second output node of the amplifier and an electrical potential of the output node of the reference amplifier and for outputting the amplified difference as a reading signal in response to the control signal.

5. The amplifier according to claim 1, wherein the first, the second and the fifth transistors are PMOS transistors and the third, the fourth and the sixth transistors are NMOS transistors.

6. The amplifier according to claim 1, wherein the amplification circuit further includes an eighth transistor connected to the third transistor and the fourth transistor, and the control signal is gate-input to the eighth transistor.

7. The amplifier according to claim 1, wherein the second power supply potential is a grounding potential.

8. The amplifier according to claim 2, wherein the seventh transistor is an NMOS transistor.

9. The semiconductor storage device according to claim 4, wherein each of the first and the second memory cells includes a MOS transistor.

10. The semiconductor storage device according to claim 4, wherein the semiconductor storage device is an EPROM.

11. The semiconductor storage device according to claim 4, wherein the semiconductor storage device is an EEPROM.

12. The amplifier according to claim 1, wherein the amplifier is applied to a semiconductor device which needs to suppress an influence by a noise of an input signal caused by the use of the amplifier.

13. An amplifier comprising:

an input node being shifted from a first power supply potential to a second power supply potential during a first mode in response to a selection signal, and being maintained at the first power supply potential during a second mode;

an amplification circuit connected to the input node for amplifying an electrical potential of the input node and outputting the amplified potential from a first output node in response to a control signal, the amplification circuit including:

a first transistor having a first control electrode, a first electrode connected to a first power supply potential node or a second power supply potential node, and a second electrode connected to the first output node, a second transistor having a second control electrode connected to the first control electrode, a third electrode connected to the first power supply potential node or the second power supply potential node, and a fourth electrode connected to the second control electrode, a third transistor having a third control electrode connected to the input node, a fifth electrode connected to the second power supply potential node or the first power supply potential node, and a sixth electrode connected to the first output node, and a fourth transistor having a fourth control electrode applied an intermediate electrical potential between the first power supply potential and the second power supply potential, a seventh electrode connected to the second power supply potential node or the first power supply potential node, and an eighth electrode connected to the fourth electrode; and a constant voltage circuit connected to the first output node for stabilizing the electrical potential of the first output node and outputting the stabilized potential from a second output node, the constant voltage circuit including:

a fifth transistor having a fifth control electrode connected to the second output node, a ninth electrode connected to the first power supply potential node, and a tenth electrode connected to the fifth control electrode, and and a sixth transistor having a sixth control electrode connected to the first output node, an eleventh electrode connected to the input node, and a twelfth electrode connected to the tenth electrode;

wherein a dimension of the first transistor is n times as large as that of the second transistor, and a dimension of the third transistor is n times as large as that of the fourth transistor, where n denotes an arbitrary number more than 1.

14. A semiconductor storage device using the amplifier of claim 13, the semiconductor storage device comprising:
a plurality of word lines arranged in parallel to each other so as to be decoded by an external address input;
a plurality of first bit lines arranged in parallel having predetermined spaces therebetween, the first bit lines extending perpendicular to the word lines;
a plurality of second bit lines respectively arranged beside the first bit lines so as to define a plurality of pairs of first and second bit lines, the second bit lines being parallel with the first bit lines and connected to the second power supply potential node of claim 13 in response to the selection signal of claim 13 decoded by an address input;
a third bit line arranged in parallel with the second bit lines;
a fourth bit line arranged beside the third bit line so as to define a pair of third and fourth bit lines, the fourth bit line being parallel with the third bit line and connected to the second power supply potential node;
a plurality of first memory cells respectively positioned at intersecting points of the word lines, and the pairs of first and second bit lines so as to form a matrix pattern, each said first memory cell including a first electrode connected to the first bit line concerned, a second electrode connected to the second bit line paired with the first bit line concerned, and a floating gate connected to the word line concerned;
a plurality of second memory cells respectively positioned at intersecting points of the word lines, and the pair of third and fourth bit lines, each said second memory cell including a first electrode connected to the third bit line, a second electrode connected to the fourth bit line, and a floating gate connected to the word line concerned;
an amplifier of claim 13 commonly connected to one ends of the first bit lines;
a reference amplifier connected to one end of the third bit line for amplifying an electrical potential of the one end of the third bit line and outputting the amplified potential to an output node in response to the control signal of claim 13, and the reference amplifier including an amplifying circuit which is the same as the amplification circuit of claim 13, and a constant voltage circuit formed by a transistor having a dimension multiple times as large as that of the fifth transistor of claim 13, and a transistor identical to the sixth transistor of claim 13; and
a differential amplifier connected to a second output node of the amplifier and an output node of the reference amplifier for amplifying a difference between an electrical potential of the second output node of the amplifier and an electrical potential of the output node of the reference amplifier and for outputting the amplified difference as a reading signal in response to the control signal.

15. The semiconductor storage device according to claim 14, wherein the semiconductor storage device is an EPROM.

16. The semiconductor storage device according to claim 14, wherein the semiconductor storage device is an EEPROM.

17. An amplifier comprising:
input means being shifted from a first power supply potential to a second power supply potential during a first mode in response to a selection signal, and being maintained at the first power supply potential during a second mode;
amplification means connected to the input means for amplifying an electrical potential of the input means and outputting the amplified potential from a first output node in response to a control signal, the amplification means including:
a first transistor having a first control electrode, a first electrode connected to a first power supply potential node or a second power supply potential node, and a second electrode connected to the first output node,
a second transistor having a second control electrode connected to the first control electrode, a third electrode connected to the first power supply potential node or the second power supply potential node, and a fourth electrode connected to the second control electrode,
a third transistor having a third control electrode connected to the input means, a fifth electrode connected to the second power supply potential node or the first power supply potential node, and a sixth electrode connected to the first output node, and
a fourth transistor having a fourth control electrode applied an intermediate electrical potential between the first power supply potential and the second power supply potential, a seventh electrode connected to the second power supply potential node or the first power supply potential node, and an eighth electrode connected to the fourth electrode; and
constant voltage means connected to the first output node for stabilizing the electrical potential of the first output node and outputting the stabilized potential from a second output node, the constant voltage means including:
a fifth transistor having a fifth control electrode connected to the second output node, a ninth electrode connected to the first power supply potential node, and a tenth electrode connected to the fifth control electrode,
a sixth transistor having a sixth control electrode connected to the first output node, an eleventh electrode connected to the input means, and a twelfth electrode connected to the tenth electrode, and
a pull-down element connected between the input means and the second power supply potential node.

18. The amplifier according to claim 17, wherein the pull-down element includes a seventh transistor having a seventh control electrode connected to the input means, a thirteenth electrode connected to the second power supply potential node, and a fourteenth electrode connected to the seventh control electrode.

19. The amplifier according to claim 17, wherein the pull-down element includes a resistor element connected between the input means and the second power supply potential node.

20. An amplifier comprising:
input means being shifted from a first power supply potential to a second power supply potential during a first mode in response to a selection signal, and being maintained at the first power supply potential during a second mode;
amplification means connected to the input means amplifying an electrical potential of the input means and for outputting the amplified potential from a first output node in response to a control signal, the amplification means including:

a first transistor having a first control electrode, a first electrode connected to a first power supply potential node or a second power supply potential node, and a second electrode connected to the first output node, a second transistor having a second control electrode connected to the first control electrode, a third electrode connected to the first power supply potential node or the second power supply potential node, and a fourth electrode connected to the second control electrode, a third transistor having a third control electrode connected to the input means, a fifth electrode connected to the second power supply potential node or the first power supply potential node, and a sixth electrode connected to the first output node, and a fourth transistor having a fourth control electrode applied an intermediate electrical potential between the first power supply potential and the second power supply potential, a seventh electrode connected to the second power supply potential node or the first power supply potential node, and an eighth electrode connected to the fourth electrode; and constant voltage means connected to the first output node for stabilizing the electrical potential of the first output node and outputting the stabilized potential from a second output node, the constant voltage means including:

a fifth transistor having a fifth control electrode connected to the second output node, a ninth electrode connected to the first power supply potential node, and a tenth electrode connected to the fifth control electrode, and a sixth transistor having a sixth control electrode connected to the first output node, an eleventh electrode connected to the input means, and a twelfth electrode connected to the tenth electrode;

wherein a dimension of the first transistor is n times as large as that of the second transistor, and a dimension of the third transistor is n times as large as that of the fourth transistor, where n denotes an arbitrary number more than 1.

* * * * *